(12) United States Patent
Yazawa

(10) Patent No.: US 7,209,348 B2
(45) Date of Patent: Apr. 24, 2007

(54) HEAT DISSIPATING STRUCTURE FOR AN ELECTRONIC DEVICE AND HEAT DISSIPATING DEVICE

(75) Inventor: Kazuaki Yazawa, Tokyo (JP)

(73) Assignee: Sony Computer Entertainment Inc., Tokyo (JP)

(*) Notice: Subject to any disclaimer, the term of this patent is extended or adjusted under 35 U.S.C. 154(b) by 134 days.

(21) Appl. No.: 11/080,575

(22) Filed: Mar. 15, 2005

(65) Prior Publication Data

US 2005/0219814 A1 Oct. 6, 2005

Related U.S. Application Data

(63) Continuation-in-part of application No. 10/681,073, filed on Oct. 8, 2003, now Pat. No. 7,099,153.

(30) Foreign Application Priority Data

Apr. 5, 2004 (JP) ............................ 2004-111542

(51) Int. Cl.
*H05K 7/20* (2006.01)

(52) U.S. Cl. ............... 361/687; 361/690; 361/688; 361/707; 165/80.3; 165/185

(58) Field of Classification Search ........... 361/687, 361/679, 689, 690–695, 702, 703–704, 712–724; 454/43, 184; 165/80.3, 128, 129, 185; 257/713–726; 219/209, 385, 400; 312/223.1, 223.2, 236; 124/16.1, 16.3; 174/15.1, 16.3, 252
See application file for complete search history.

(56) References Cited

U.S. PATENT DOCUMENTS 6,833,991 B2 * 12/2004 Van Gaal ................. 361/690

FOREIGN PATENT DOCUMENTS

JP 09-212258 8/1997

(Continued)

OTHER PUBLICATIONS

Solbrekken, G. L., Coxe, W. K., Yazawa, K. and Bar-Cohen, A., "Passive Cooling Limits for Ventilated Notebook Computers," Proceedings of 12th International Heat Transfer Conference, 2002.

(Continued)

*Primary Examiner*—Michael Datskovskiy
(74) *Attorney, Agent, or Firm*—Frommer Lawrence & Haug LLP; William S. Frommer; Thomas F. Presson

(57) ABSTRACT

A heat dissipating member has an inner wall, outer wall, and partition walls. The inner wall directly or indirectly receives heat transfer from the heat source. The outer wall opposes the inner wall at a distance. The partition walls connect the inner wall and the outer wall. The inner wall, the outer wall, and the partition walls define a plurality of through-holes along the inner wall and the outer wall. Each of the through-holes extends in a vertical direction within a tilt range in which gravitational influence is utilizable. Upper and lower ends of each of the through-holes open to the outside. Generated heat from the heat source is propagated to the outer wall via the inner wall and the partition walls. A predetermined amount of heat generated by the heat source passing through the outer side of the outer wall is determined so that rise in temperature of the outer side relative to the ambient temperature can be kept under a predetermined value.

8 Claims, 6 Drawing Sheets

FOREIGN PATENT DOCUMENTS

| | | |
|---|---|---|
| JP | 11-233977 | 8/1999 |
| JP | 2002-111263 | 4/2000 |
| JP | 2000-352399 | 12/2000 |

OTHER PUBLICATIONS

Elenbaas, W., "The Dissipation of Heat by Free Convection: The Inner Surface of Vertical Tubes of Different Shapes of Cross-Section," Physica (IX/8), pp. 865-874, 1942.

Iwasaki, H. and Ishizuka, M., "Natural convection Air Cooling Characteristics of Plate Fins in a Ventilated Electronic Cabinet," Thermal Science & Engineering, vol. 8, No. 1, 2000.

Allan D. Kraus et al., "Design and Analysis of Heat Sinks," 1995 A Wiley-Interscience Publication, pp. 286-291.

Akash Jain et al., "Buoyancy-Driven Flow in Channels With In-Line Pin Fins" Proceedings of ASME NHTC'01, 35th National Heat Transfer Conference Anaheim, California, Jun. 10-12, 2001, pp. 1-8.

William K. Coxe III et al., "Experimental Modeling of the Passive Cooling Limit of Notebook Computers," 2002 Inter Society Conference on Thermal Phenomena, pp. 15-21.

Kazuaki Yazawa, "Natural Convection Enhancement of Channel Array in Conjunction With Wall Surface".

* cited by examiner

HEAT DISSIPATING STRUCTURE FOR AN ELECTRONIC DEVICE AND HEAT DISSIPATING DEVICE

CROSS-REFERENCE TO RELATED APPLICATIONS

This application is a continuation-in-part application of application Ser. No. 10/681,073, filed on Oct. 8, 2003 now U.S. Pat. No. 7,099,153, and claims priority from Japanese Patent Application No. 2004-111542, filed on Apr. 5, 2004, the disclosures of which are hereby incorporated by reference herein.

BACKGROUND OF THE INVENTION

1. Field of the Invention

The present invention relates to a heat dissipating structure for an electronic device and a heat dissipating device.

2. Description of the Related Art

A conventional heat dissipating structure for an electronic device that utilizes natural convection due to the so-called chimney effect is described in Japanese Patent Application Laid-open Hei 9-212258. With this structure, the upper and lower ends of a chimney passageway are respectively opened to the outside so as to dissipate heat by utilizing the air that naturally flows upwards through the chimney passageway.

Nevertheless, the conventional structure does not particularly consider the rise in temperature in the region exposed to the outside, whereby inconveniences may arise during actual use.

SUMMARY OF THE INVENTION

The present invention aims to provide a heat dissipating structure for an electronic device that can control the rise in temperature in the region exposed to the outside, as well as can achieve an efficient heat dissipating effect utilizing natural convection with consideration of such above issue.

In order to achieve the objective described above, the heat dissipating structure for an electronic device according to the present invention includes a heat source (or heat sources) and a heat dissipating member. The heat dissipating member has an inner wall, an outer wall, and multiple partition walls. The inner wall directly or indirectly receives heat transfer from the heat source(s). The outer wall has an inner side and an outer side. The inner side opposes the inner wall at a distance therefrom, and the outer side is exposed to the outside. The partition walls connect the inner wall and the inner side of the outer wall. The inner wall, outer wall and partition walls define multiple through-holes. The through-holes are arranged along at least one of either the inner wall or the outer wall. Each of the through-holes extends in a vertical direction within a tilt range in which gravitational influence is utilizable. Upper and lower ends of each of the through-holes open to the outside.

The heat from the heat source is propagated to the outer wall via the inner wall and the partition walls. A predetermined amount of heat generated by the heat source passing through the outer side of the outer wall is determined so that the rise in temperature of the outer side relative to the ambient temperature can be kept below a predetermined value.

It should be noted that a through-hole means a space allowing air circulation therein when a difference in pressure occurs on both sides thereof regardless of cross-sectional shape.

It is preferable that the tilt of the through-holes from a plumb line is under 60°, more preferably under 30° toward vertical. The through-holes may be lined up approximately in line or in a circle.

With the above-structure, heat from the heat source directly or indirectly propagates to the inner wall of the heat dissipating member, and then further propagates to the outer wall thereof via multiple partition walls. This heats the air within the through-holes that are sectioned off by the inner wall, the partition walls, and the outer wall. The through-holes vertically extend within the tilt range that allows effective utilization of gravitational influence, and are open to the outside at the upper and lower ends thereof. Consequently, when the temperature of the air within the through-holes rises, natural convection upwardly occurs, namely heat dissipation occurs due to the chimney effect, which allows effective heat release.

Furthermore, a predetermined amount of heat generated by the heat source passing through the outer side of the outer wall is determined so that the rise in temperature of the outer side relative to the ambient temperature can be controlled to be below a predetermined value. Consequently, the rise in temperature in the region exposed to the outside (outer side) may be accurately controlled.

Moreover, since the heat dissipating member has an inner wall and an outer wall that are connected via multiple partition walls, it can function as an enforcing member with great mechanical strength.

At least the region of the inner wall that directly or indirectly receives heat transfer from the heat source may be made of a highly thermally conductive material, and at least the outer side of the outer wall may be made of a low thermally conductive material.

Thermal conductivity in the region of the inner wall that directly or indirectly receives heat transfer from the heat source is preferably 20 W/mK or higher, more preferably between 150 W/mK and 400 W/mK. Thermal conductivity of at least the outer side of the outer wall is preferably between 0.2 Wm/K and 5.0 W/mK.

For example, at least the region of the inner wall that directly or indirectly receives heat transfer from the heat source may be made of a highly thermally conductive metal, and at least the region of the outer side of the outer wall that is exposed to the outside may be made of a low thermally conductive resin.

With the above-mentioned structure, since the region of the inner wall that directly or indirectly receives heat transfer from the heat source is made of a highly thermally conductive material, heat transfer from the heat source into the through-holes is effectively performed. Meanwhile, since the outer side of the outer wall is made of a low thermally conductive material, rise in temperature of the outer side that is exposed to the outside may be accurately controlled.

The inner wall, the partition walls, and the inner side of the outer wall are made of the same material, and the partition walls may have a shape that tapers from the inner wall towards the outer wall.

With the above-mentioned structure, the partition walls are in a tapered shape, and the contact area between the partition walls and the outer wall is kept small. Consequently, even if the inner wall, partition walls, and the inner side of the outer wall are integrally made of a highly thermally conductive material, heat transfer from the partition walls to the outer wall is limited. Accordingly, the rise in temperature of the outer side that is exposed to the outside may be accurately controlled. Furthermore, since the inner wall, the partition walls, and the inner side of the outer wall may be integrally formed, and the inner wall side of the partition walls may be formed to have a sufficient thickness in view of strength, they do not lose their function as enforcing members.

The cross-section that is vertically orthogonal to the through-holes may be approximately a quadrilateral. Furthermore, the width of the through-holes along the inner wall and the outer wall, the interval between the inner wall and the outer wall, and the thickness of the partition walls may be set in accordance with the thermal conductivity of the partition walls so as to effectively achieve a chimney effect due to the through-holes and heat transfer from the outer wall.

With the above-mentioned structure, since the dimensions and shape of the through-holes and the thickness of the partition walls are set in accordance with the thermal conductivity of the partition walls so as to effectively achieve a chimney effect due to the through-holes and heat transfer (heat dissipation) from the outer wall, extremely effective heat dissipation is possible.

The multiple through-holes may have approximately the same shape, and may be lined up along either the inner wall or the outer wall at regular intervals.

With the above-mentioned structure, since the partition walls are lined up along the inner wall and outer wall at regular intervals, equal heat transfer from the inner wall to the outer wall occurs along the length of the inner wall and the outer wall. As a result, the temperature difference among the inner wall, partition walls, and the outer wall may be kept small. In other words, since the difference (temperature gradient) in ambient temperature of the through-holes that function as chimney passageways can be minimized, the air within the through-holes will flow smoothly, thereby achieving an extremely favorable chimney effect. Furthermore, since each of the through-holes is roughly the same shape, the equivalent chimney effect may be achieved therewith. Accordingly, more effectively achieving a heat dissipating effect due to natural convection is possible.

The cross-sectional shapes of the through-holes that are orthogonal to the vertical direction may be set to be roughly the same at arbitrary positions in the vertical direction.

With the above-mentioned structure, since the air flows upward more smoothly, the heat dissipation due to natural convection is taken effect.

A heat diffusing member that touches the heat source and the outer side of the inner wall may be provided between the heat source and the inner wall of the heat dissipating member. Furthermore, the inner wall of the heat dissipating member may be structured so as to have a heat diffusing function, and be positioned to touch the heat source.

With the above-mentioned structure, since the temperature difference between the portion of the inner wall close to the heat source and portion far apart from the heat source is further reduced due to the heat dissipating function of the heat diffusing member or the inner wall, multiple through-holes may function equally, and the heat dissipating effect is further improved.

It is preferable that the cross-sectional shape that is vertically orthogonal to the through-holes is approximately a square.

With the above-mentioned structure, since the cross-section that is orthogonal to the vertical direction of the through-holes is approximately a square, and the upward flow of air is smoother, the heat dissipating effect due to natural convection is further improved.

The heat source and heat dissipating member may be housed in a case so as to make the outer side of the outer wall of the heat dissipating member have surface contact with the inner side of the case, or an enclosed space may be sectioned off by the inner wall of the heat dissipating member so as to house the heat source within that enclosed space.

With the above-mentioned structure, since heat dissipation from the outer wall of the heat dissipating member occurs either directly or via the case, the heat dissipating effect is improved overall.

The outer side of the outer wall of the heat dissipating member may have a cooling fin.

With the above-mentioned structure, the heat release from the outer wall of the heat dissipating member increases, further improving the heat dissipating effect overall.

As such, according to the present invention, since heat dissipation occurs due to the chimney effect in addition to heat transfer from the outer side of the outer wall, efficient heat dissipation is possible. Furthermore, rise in temperature in the region exposed to the outside can be appropriately controlled.

Artisans will fully understand the above and further objects and features of the present invention by reading preferred embodiments of the invention described herein in connection with the accompanying drawings, including features recited in the appended claims, as well as explicit and implicit effects and advantages of the invention, including those to be apparent through implementation of the invention.

DETAILED DESCRIPTION OF THE PREFERRED EMBODIMENTS

Figure 1:
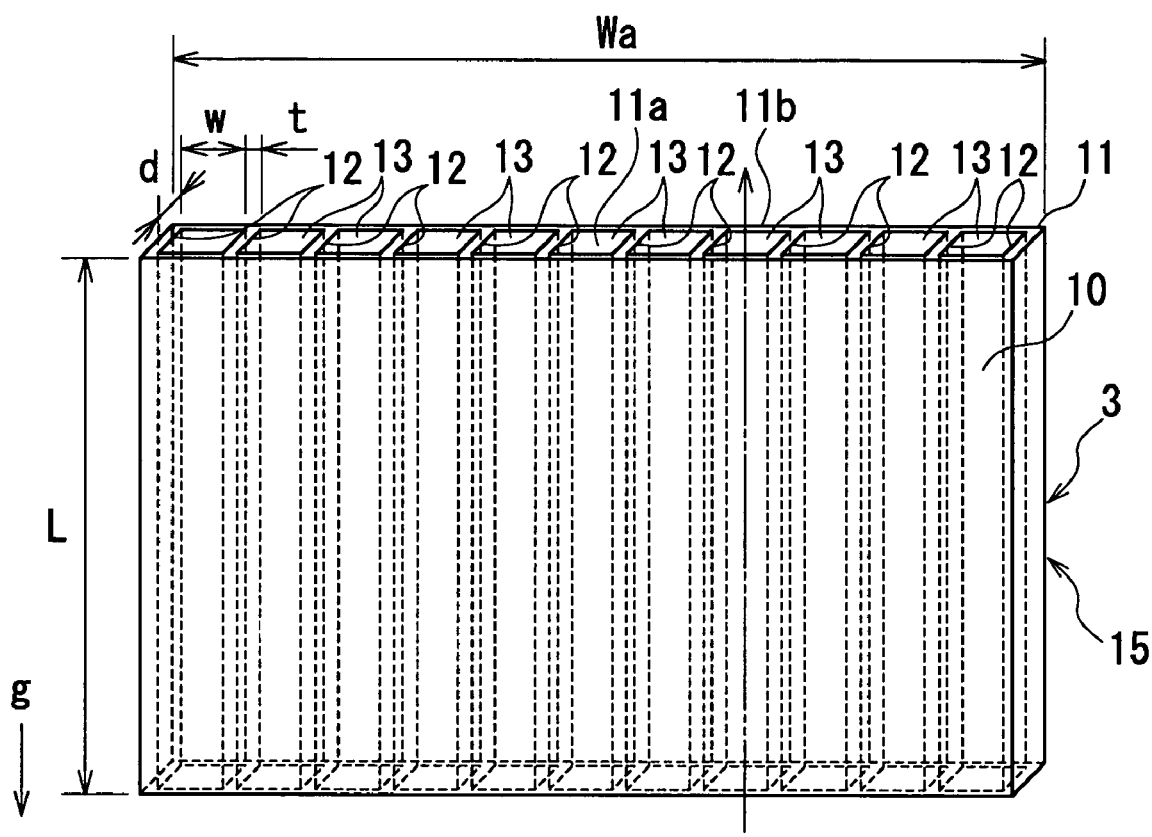
FIG. 1 is a perspective view of the main parts of a heat dissipating structure for an electronic device according to a first embodiment of the present invention.

A preferred embodiment of the present invention is described below with reference to the accompanying drawings. It is noted that like parts or elements are designated by like reference characters in the drawings, without redundant description of the parts or elements.

Figure 2:
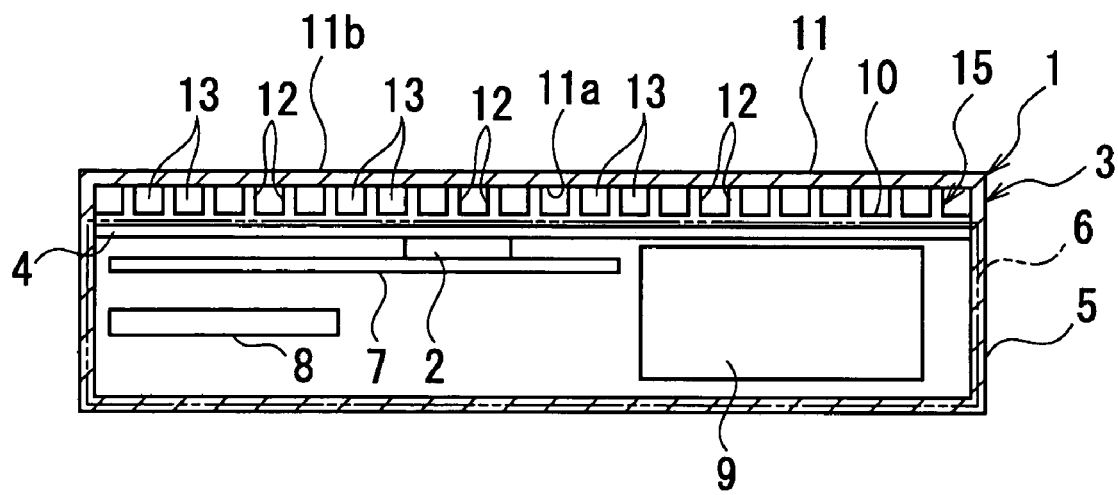
FIG. 2 is a general cross-sectional view of the heat dissipating structure of FIG. 1.
Figure 3:
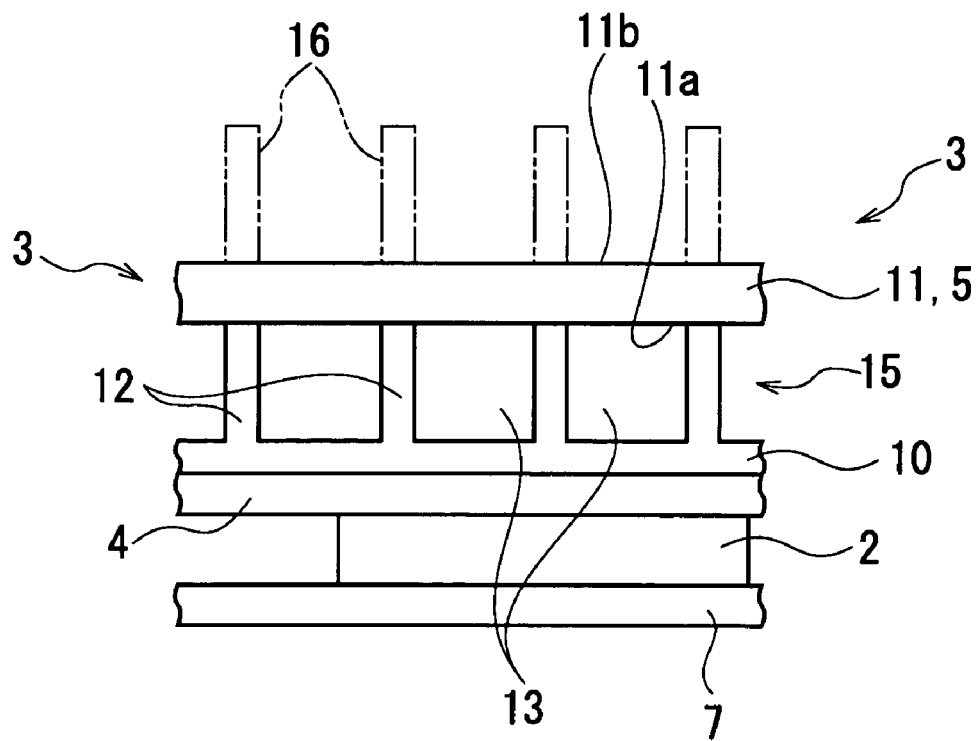
FIG. 3 is a cross-sectional view of the main parts of the heat dissipating structure of FIG. 1.
Figure 4:
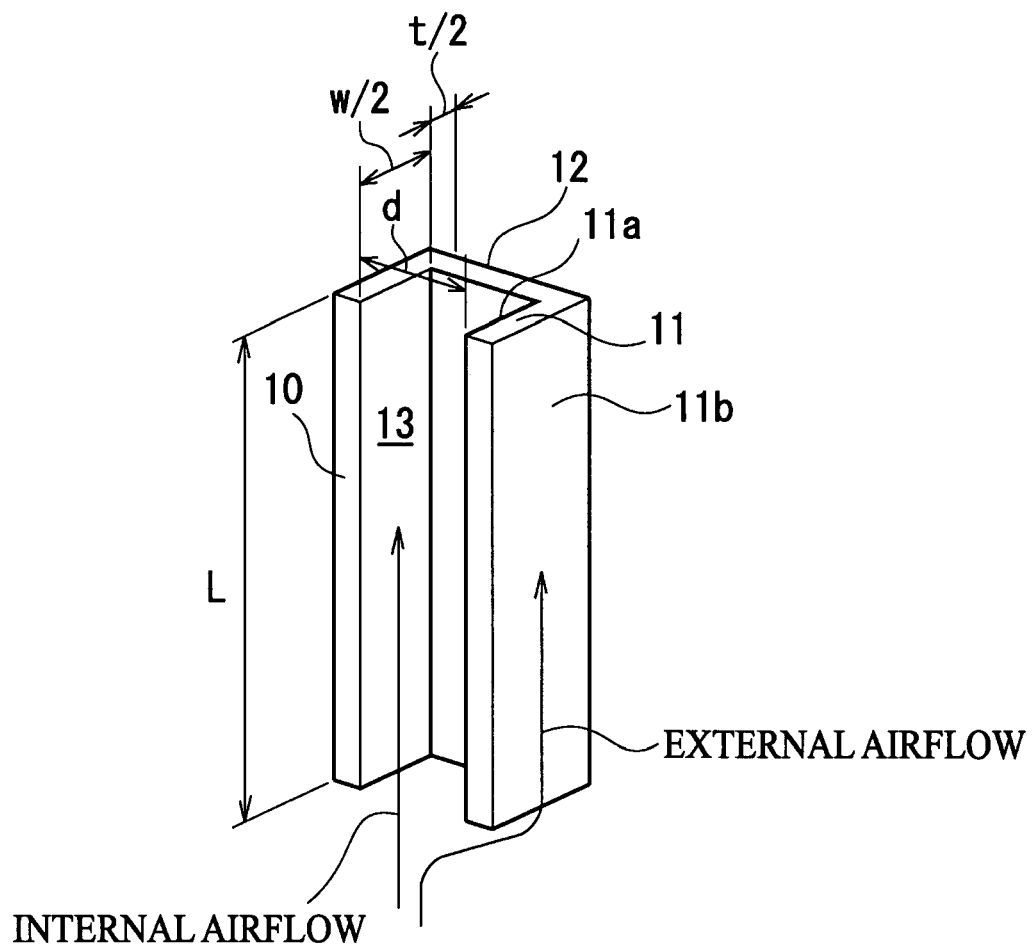
FIG. 4 is a perspective view of the main parts of the heat dissipating structure of FIG. 1.
Figure 5:
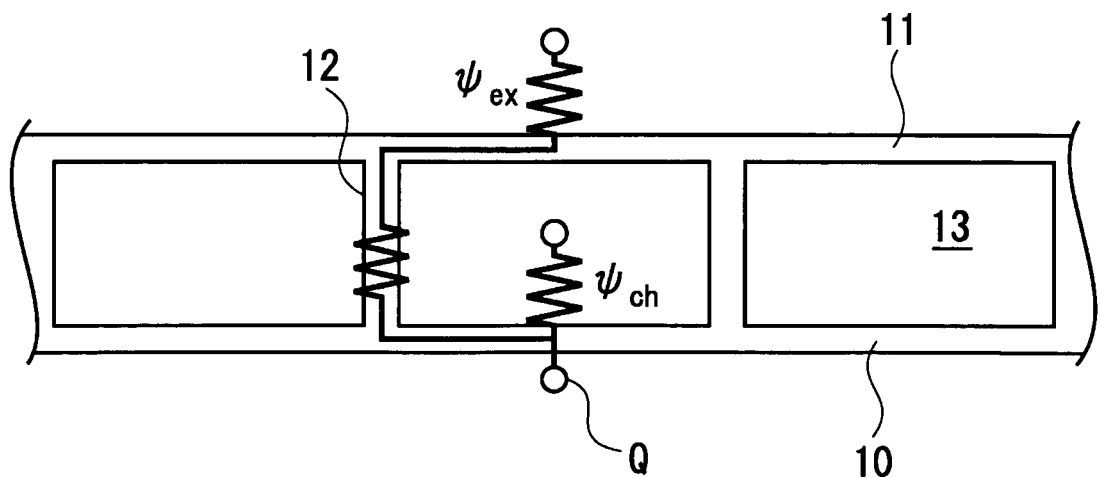
FIG. 5 is a schematic of a model of the heat dissipating structure of FIG. 1.

FIG. 1 is a perspective view of the main parts of a heat dissipating structure for an electronic device according to this embodiment, and FIG. 2 is a general cross-sectional view of the heat dissipating structure of FIG. 1. FIG. 3 is a cross-sectional view of the main parts of the heat dissipating structure of FIG. 1, FIG. 4 is a perspective view of the main parts of the heat dissipating structure of FIG. 1, and FIG. 5 is a schematic of a model of the heat dissipating structure of FIG. 1.

Outline of Heat Dissipating Structure and Configuration of Electronic Device Having the Same As illustrated in FIG. 2, the heat dissipating structure for an electronic device according to this embodiment includes a case 1, a heat source 2, a heat dissipating member 3, which acts as a heat device, and a spreader 4.

The case 1 includes a rectangular tube-shaped peripheral wall 5, and a cover 6 which is fixed on the top and bottom of the peripheral wall 5, where the electronic device is utilized in a state where the peripheral wall 5 is installed in a roughly vertical direction. The peripheral wall 5 and cover 6 are both made of a low thermally conductive synthetic resin (for example, ABS resin). In addition to the heat source 2, heat dissipating member 3, and spreader 4, various electronic parts 7, 8, and 9 are housed and fixed within the case 1. For example, in the case where the electronic device is a personal computer, a CPU, a hard disc drive, main memory, an AC power adapter or the like is the heat source 2.

The heat dissipating member 3 is structured of a highly thermally conductive heat dissipating base material 15 having an inner wall 10 and multiple partition walls 12, and an outer wall 11 which is a side wall of the peripheral wall 5. The heat dissipating base material 15 is fixed on the peripheral wall 5 side using screws or through welding or the like, and the heat dissipating member 3 configures a side wall portion of the case 1 on the whole. The inner wall 10 and outer wall 11 both have an approximately flat plate shape, opposing each other roughly parallel with space therebetween. The partition walls 12 extend in a roughly vertical direction and are arranged roughly parallel at regular intervals along the inner wall 10 and the outer wall 11 so as to connect the inner wall 10 and an inner side 11a of the outer wall 11. Accordingly, the inner wall 10, outer wall 11, and partition walls 12 define multiple through-holes 13, which have roughly the same shape and are aligned approximately linear at roughly regular intervals along the direction that is approximately orthogonal to the vertical direction. It should be noted that multiple cooling fins 16 (indicated by chain double-dashed lines in FIG. 3) that extend in the vertical direction may be provided on an outer side 11b of the outer wall 11.

The through-holes 13 are set so as to extend approximately linear in the vertical direction within the tilt range in which gravitational influence is utilizable during electronic device usage. More specifically, it is preferable that the tilt of the through-holes 13 from a plumb line is under 60°, more preferably under 30°. However, in this embodiment, it is fixed in a roughly vertical direction that is more preferable (a direction approximately parallel to gravitational acceleration g). The cover 6 closes the portion of the region surrounded by the upper end and the lower end of the peripheral wall 5 of the case 1 excluding the through-holes 13, wherein the upper and lower ends of the through-holes 13 are open to the outside of the case 1.

The spreader 4 functions as a heat diffusing member and is positioned between the heat source 2 and the inner wall 10 of the heat dissipating member 3. The front and the back side of the spreader 4 touch the heat source 2 and almost the entire outer side of the inner wall 10, respectively, wherein the inner wall 10 indirectly receives heat transfer from the heat source 2 via the spreader 4. The spreader 4 is made of a highly thermally conductive metal (for example, magnesium, aluminum, copper, silver, gold or the like), and diffuses and transfers to the inner wall 10 the heat received from the heat source 2 through contact therewith. A spreader with a built-in thin two-layer heat transport mechanism (a vapor chamber, closed loop heat pipe or the like) may also be provided as the heat diffusing member. Furthermore, without additionally providing a heat diffusing member, the inner wall 10 may function to diffuse heat by forming it with a metal of high thermal conductivity, whereby in this case, the heat dissipating member is positioned to touch the heat source.

Relationship Between Outer Wall and Through-Holes

When there is a possibility that the outer side 11b of the outer wall 11 exposed to the outside may be touched by a user, the temperature of the outer side 11b needs to be kept under a predetermined allowable maximum temperature. Meanwhile, the higher the temperature of the outer side 11b of the outer wall 11, the better the heat dissipation performance from the outer wall 11, and in the case of emission by natural convection in the vertical surface, it is known to be in proportion to the $1.25^{th}$ power of the temperature difference from the ambient temperature (however, excluding heat radiation to the periphery.) Accordingly, in order to maximize the heat dissipation effect from the outer side 11b, the temperature of the outer side 11b is preferably kept under the allowable maximum temperature and close thereto.

Meanwhile, since the temperature of the electronic device interior including the heat source 2 during operation generally increases to be higher than the above-mentioned allowable maximum temperature, heat dissipation is necessary. In this embodiment, heat radiation by natural convection from the outer side 11b is maximized while the internal heat is radiated through the multiple through-holes 13. Namely, the heat dissipating member 3 has a structure allowing both a chimney effect (described hereafter) due to the multiple through-holes 13 and maximization of heat dissipation from the outer side 11b of the outer wall 11 while keeping it under the allowable maximum temperature.

Structure Suitable for Chimney Effect

When there is a temperature difference between the air and two parallel infinitely distant flat planes, buoyancy is generated due to the air between the flat planes heated through heat transfer from the planes, which allows the heated air to begin to move from the lower openings towards the upper openings against gravity. The heat dissipating effect due to this movement (flow) is called a chimney effect. When this flow becomes a sufficiently steady state, the heat dissipating effect can be determined depending on inter-plane distance, vertical length, and temperature difference from the air. When other conditions are fixed, and the inter-plane distance is extremely small (narrow), heat transfers from respective flat surfaces interfering with each other, resulting in a united heat transfer (called complete development limit), and the heat dissipation performance at that time is proportional to the inter-plane distance to the fourth power. As this distance is widened, mutual plane interferences are weakened to be independent (called independent heat transfer limit). Heat dissipation performance at that time is proportional to the inter-plane distance, and is proportional to the vertical length to the ¾-th power. Consequently, by examining not unlimited but limited-width through-holes (the cross-sectional shape that is orthogonal to the vertical length is a quadrilateral), it is assumed with ease that the smaller distance between two opposing flat planes will decide the heat transfer limit and that heat release depends on the cross-sectional area. Accordingly, it can be understood that a form with the same distances between the respective two opposing surfaces, namely a square cross-section allows most effective heat dissipation. Moreover, in the case of the heat dissipating member 3 configuring a side wall of the case 1 on the whole as in this embodiment, when the through-holes 13 need to be set at regular intervals, heat dissipation can be maximized by providing close to the side wall of the case 1 the through-holes 13 each having a square cross-section, which are defined by the partition walls 12 with a predetermined thickness using the side interval (inter-opposing side interval of the inner wall 10 and the outer wall 11) determined from the thickness of the entire side wall portion as a standard. It should be noted that with the present invention, since each of the partition walls 12 holds a temperature gradient, the mean temperature of regions of the partition walls 12 facing the through-holes 13 is used as and represents the temperature of the partition walls 12 during performance evaluation.

Through-Hole Shape

With a temperature rise of the inner wall 10 within the range between 5° C. and 30° C. relative to the air (ambient temperature), if the cross-sectional shape of through-holes 13 that effectively dissipate heat due to the chimney effect is a square or a rectangle, each side thereof is within the range of 6 mm to 20 mm, and if it is circular or elliptic form, the diameter thereof (major axis or minor axis) is within the range of 6 mm to 20 mm. For example, when the temperature difference is 15° C., a square shape with 11 mm sides is optimal, and the closer to this shape, the better. Furthermore, it is preferable that the cross-sectional shapes of the through-holes 13 orthogonal to the vertical direction (plumb line direction) are set to be roughly the same at arbitrary positions in the vertical direction (plumb line direction).

Inner Wall Material

It is ideal that the entire inner wall 10 has uniform temperature, and spreading the heat from the heat source 2 over the entire wall is important for improving heat dissipation performance. Accordingly, the inner wall 10 of this embodiment is made of a highly thermally conductive material, and the thermal conductivity thereof is preferably 20 W/mK or greater, more preferably between 150 W/mK and 400 W/mK. More specifically, a metal such as copper or aluminum, a synthetic material such as carbon graphite, or a flat heat pipe or paper chamber with a heat transport mechanism built in a flat plane is preferred.

Thermal Conduction to Outer Side of Outer Wall

Thermal conduction from the inner wall 10 to the outer side 11b of the outer wall 11 depends on heat quantity passing through the partition walls 12 and the outer wall 11. Furthermore, the heat quantity passing through the partition walls 12 and the outer wall 11 depends on the material and shape thereof. Accordingly, when the heat source 2 has generated a predetermined amount of heat (when the temperature of the inner wall 10 has increased by a predetermined value relative to the ambient temperature), the material and shape of the partition walls 12 and the outer wall 111 are set such that the temperature rise of the outer side 11b of the outer wall 111 relative to the ambient temperature can be under a predetermined value. Furthermore, in this embodiment, since the partition walls 12 are made integrally with the highly thermally conductive inner wall 10, that passing heat quantity is controlled (reduced) by forming the partition walls 12 at a predetermined thickness. Moreover, the outer wall 11 is made of a low thermally conductive synthetic resin, and the passing heat quantity is controlled (reduced) due to its material. It is preferable that the thermal conductivity of the outer wall 11 should be between 0.2 and 5.0 W/mK. It should be noted that needless to say, even the temperature of the outer side 11b can be controlled by selecting a thickness of the outer wall 11.

Internal Airflow and External Airflow

As shown in FIG. 4, when the inner wall 10 is heated allowing heat to begin to move, an internal airflow occurs within the through-holes 13 and an external airflow occurs above the outer side 11b of the outer wall 11. The internal airflow contributes to heat dissipation due to the above-mentioned chimney effect, and the external airflow contributes to heat dissipation from the outer side 11b of the outer wall 11.

Heat Dissipating Effect Based on Theoretical Equations

FIG. 5 is a schematic of a model of the heat dissipating structure of FIG. 1, where the same symbols are given to the same structure corresponding to FIG. 1 for convenience. In the case where the through-holes 13 are modeled as in FIG. 5, a theoretical equation for heat quantity $Q_{ch}$ that is dissipated from the through-holes 13 due to the chimney effect is represented by the following equation (1).

$$Q_{ch} = \frac{N(T_{ch} - T_a)}{\psi_{ch}} \quad (1)$$

In the above equation (1), $\Psi_{ch}$ denotes the thermal resistance of the through-holes 13, $T_{ch}$ denotes the temperature within the through-holes 13, and $T_a$ denotes the ambient temperature. Furthermore, N denotes the number of through-holes 13 and is represented by the following equation (2).

$$N = \frac{W_a}{w + t} \quad (2)$$

In the above equation (2), w denotes the distance between the inner sides of two adjacent partitions walls 12 (interval between partition walls 12), t denotes the thickness of the partition walls 12, and $W_a$ denotes the width of the entire heat dissipating member 3. Furthermore, thermal resistance $\Psi_{ch}$ of the through-holes 13 is approximated as in the following equation (3).

$$\psi_{ch} = \frac{z2(d + w)L}{K_f Nu} \cong \frac{2}{K_f z^3 (d + w)} \quad (3)$$

In the above equation (3), $k_f$ denotes the thermal conductivity (W/mK) of air, Nu is a Nusselt Number (dimensionless thermal conductivity), d denotes the distance between the inner sides of the inner wall 10 and the outer wall 11 opposing thereto (width of the through-holes 13), and L denotes the vertical length of the through-holes 13. Furthermore, z is represented by the following equation (4).

$$z \cong \left[\frac{1}{w^{1.5}} + \frac{1}{d^{1.5}}\right]^{1/1.5} \quad (4)$$

Next, improvement in heat dissipating performance through the chimney effect is described.

Figure 6:
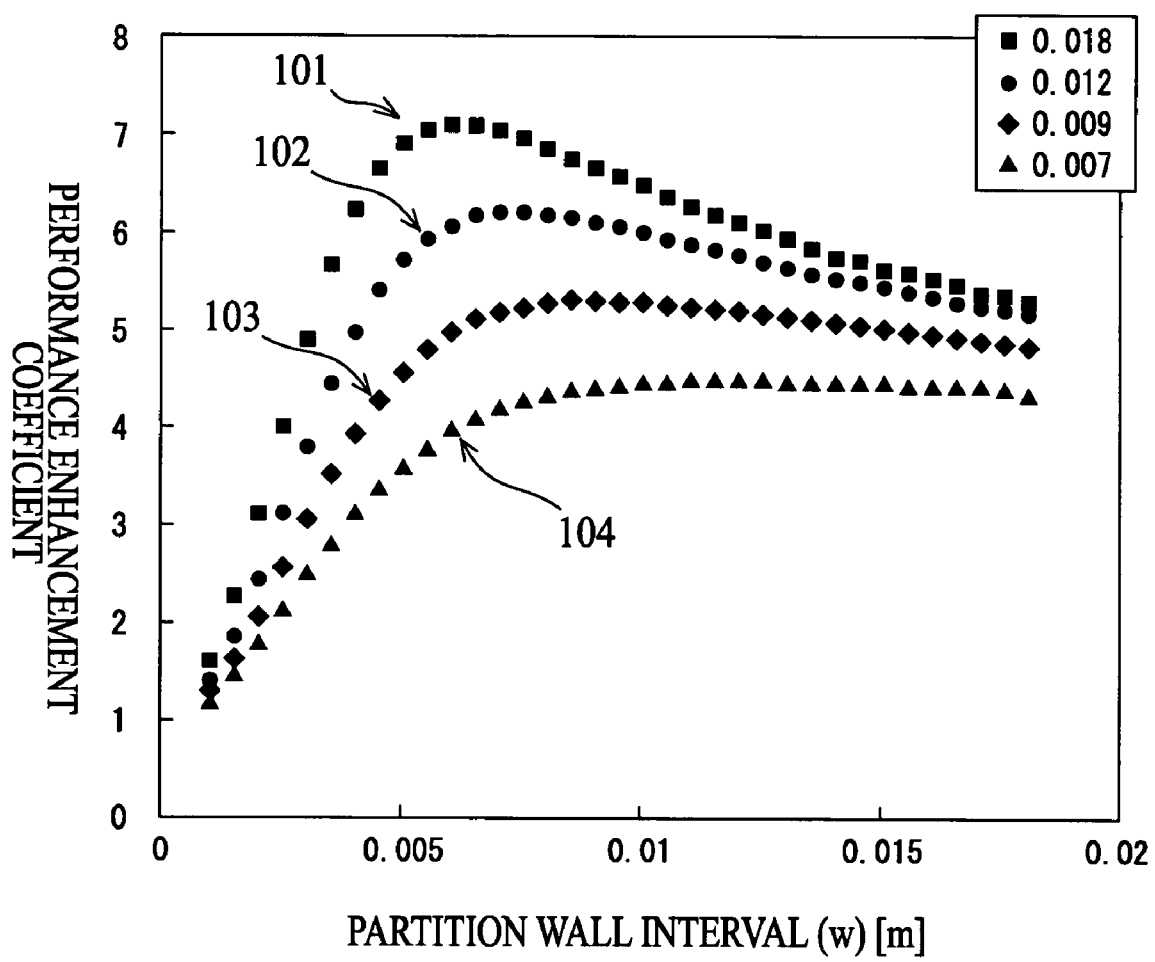
FIG. 6 is a diagram illustrating a relationship among interval w of partition walls, width d of through-holes, and a performance enhancement coefficient.

FIG. 6 is a diagram illustrating a relationship among interval w of the partition walls 12, width d of the through-holes 13, and a performance enhancement coefficient. This performance enhancement coefficient is obtained as a result of theoretically finding heat release A of the case of heat transfer from the outer side 11b of the outer wall 11 being combined with the above-mentioned model (a case including a chimney effect due to the through-holes 13) and heat release B of case of only heat transfer made from the outer wall 11 (a case not including the through-holes 13) and then calculating heat release A/heat release B. Accordingly, if the heat dissipating effects of both cases are equal, the performance enhancement coefficient is 1, and the greater the contribution from the chimney effect, the larger the value of the performance enhancement coefficient. It should be noted that in the drawing, 101 denotes the case where width d of the through-holes 13 is 0.018 m; 102 denotes width d is 0.012 m; 103 denotes width d is 0.009 m; and 104 denotes width d is 0.007 m. Furthermore, thermal conductivity $\lambda_s$ is 2 W/mK, and the length L of the through-holes 13 is 0.26 m as conditions for finding theoretical values.

As shown in FIG. 6, even when the width d of the through-holes 13 is between 0.007 and 0.018 m, the performance enhancement coefficient sharply increases as the interval w of the partition walls 12 increases, and the peak value (maximum value) falls within the range of 0.005 m to 0.01 m, then gradually decreasing. Furthermore, in each case, the performance enhancement coefficient after the peak is at least 4. Moreover, it is understood that by setting the interval w of the partition walls 12 within the range of 0.01 m±0.003 m, a heat dissipating effect of at least approximately four times that of the case without including through-holes 13 can be achieved.

Furthermore, it is not particularly shown in the drawing, however when using a highly thermally conductive material, the performance enhancement coefficient increases but the temperature of the outer side 11b of the outer wall 11 also rises along therewith. Meanwhile, when using a low thermally conductive material, a small size of through-holes 13 allows suppression of a temperature rise of the outer side 11b while controlling a decline in the performance enhancement coefficient.

Next, a relationship among the temperature of the outer side 11b of the outer wall 11, the interval w of the partition walls 12, the partition wall width t, and the width d of the through-holes 13 is described.

Figure 7:
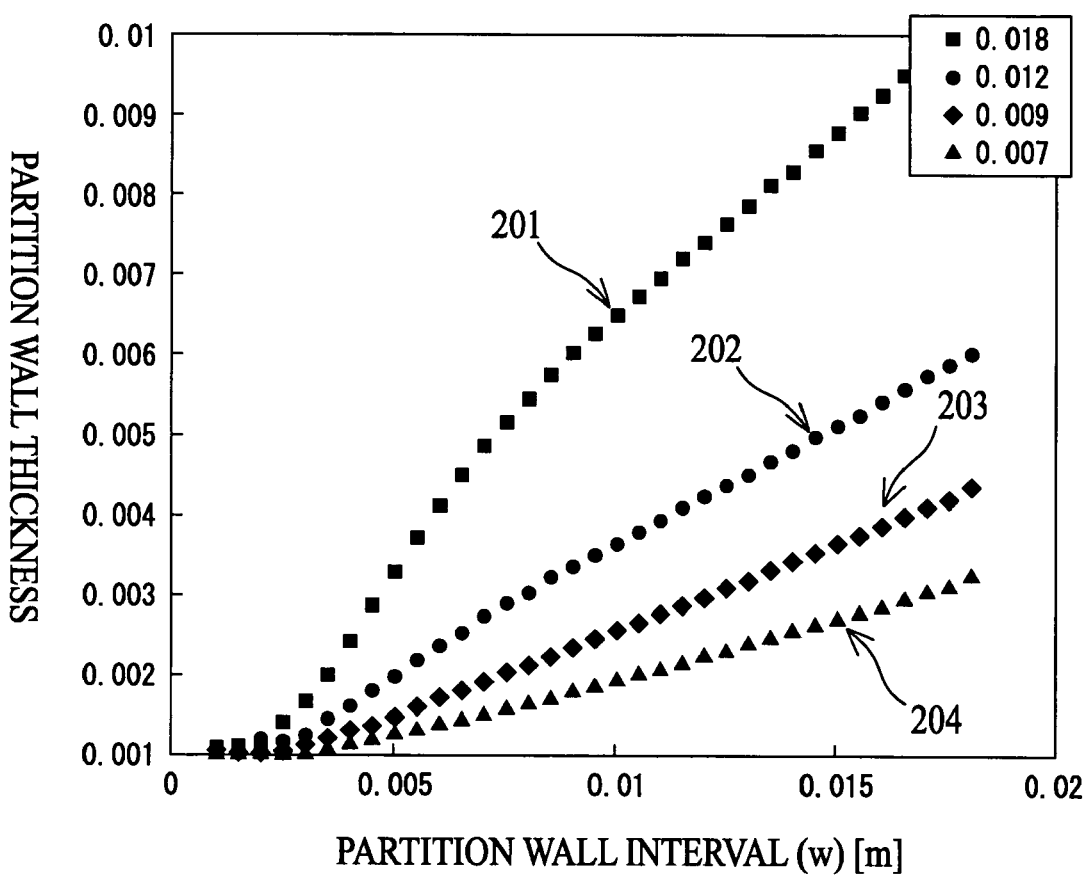
FIG. 7 is a diagram illustrating a relationship among temperature of the outer side of the outer wall, interval w of the partition walls, width t of the partition walls, and width d of the through-holes.

FIG. 7 is a diagram illustrating a relationship among temperature of the outer side 11b of the outer wall 11, width w of the partition walls 12, partition wall width t, and width d of the through-holes 13. Each dot in the drawing denotes an optimal interval w of the partition walls 12 and an optimal partition wall width t in the case of raising the temperature of the outer wall 11b of the outer wall 11 relative to the ambient temperature up to +12° C. Setting the interval w of the partition walls 12 and the partition wall width t to the optimal values allows an effective chimney effect due to the through-holes 13 and heat transfer from the outer wall 11. It should be noted that in the drawing, 201 denotes the case where width d of the through-holes 13 is 0.018 m; 202 denotes width d is 0.012 m; 203 denotes width d is 0.009 m; and 204 denotes width d is 0.007 m. Furthermore, thermal conductivity $\lambda_s$ is 2 W/mK, and the length L of the through-holes 13 is 0.26 m.

As is apparent from the relationship given in FIG. 7, by setting partition wall width t, interval w of the partition walls 12, and width d of the through-holes 13 to optimal values in accordance with the thermal conductivity of the partitions walls 12, the temperature rise of the outer side 11b of the outer wall 11 relative to the ambient temperature can be kept below a predetermined value.

According to the heat dissipating structure of this embodiment that is structured as such, the heat from the heat source 2 is propagated to the inner wall 10 of the heat dissipating member 3 via the heat diffusing member 4, and then propagated to the outer wall 11 via the multiple partition walls 12, heating the air within the through-holes 13 that are sectioned off by the inner wall 10, partition walls 12, and outer wall 11. The through-holes 13 extend roughly parallel to the plumb line direction that allows utmost effective utilization of gravitational influence, as well as are open to the outside at the upper and lower ends of the case 1. Consequently, when the temperature of the air within the through-holes 13 rises, natural convection upwardly occurs, namely heat dissipation occurs due to the chimney effect.

Since multiple partition walls 12 are lined up at regular intervals along the inner wall 10 and outer wall 11, heat transfer from the inner wall 10 to the outer wall 11 occurs equally along the length of the inner wall 10 and the outer wall 11. The temperature difference between the portion of the inner wall 10 close to the heat source 2 and portion far apart from the heat source 2 is further reduced particularly due to the heat dissipating function of the spreader 4. Accordingly, since the internal temperatures among each of the through-holes 13 are even and the through-holes 13 are roughly the same shape, the equivalent chimney effect may be achieved therewith. Furthermore, the temperature difference reduces and the heat transfer from the outer side 11b of the outer wall 11 also occurs equally along the width of the outer wall 11. Accordingly, effectively achieving a heat dissipating effect due to natural convection is possible.

Since the cross-sectional shape of the through-holes 13 that is orthogonal to the vertical direction is approximately the same at arbitrary positions in the vertical direction, the upward flow of air occurs more smoothly, improving the heat dissipating effect due to natural convection.

Since the outer wall 11 is made of a low thermally conductive synthetic resin, and a predetermined amount of heat generated by the heat source 2 passing through the outer side 11b of the outer wall 11 is determined so that the rise in temperature of the outer side 11b of the outer wall 11 relative to the ambient temperature can be controlled to be below a predetermined value, the rise in temperature of the outer side 11b that is exposed to the outside can be accurately controlled.

Since the heat dissipating member 3 is arranged within the peripheral wall 5, the appearance of the electronic device is not diminished, and an arbitrary shape of peripheral wall 5 can be designed. Furthermore, integrating the partition wall 5 and the heat dissipating member 3 allows improvement in workability for assembling the electronic device.

As in the above, since the rise in temperature of the outer side 11b of the outer wall 11 that is exposed to the outside may be kept within a predetermined range and a sufficient heat dissipating effect due to natural convection may be achieved with the heat dissipating structure of this embodiment, heat dissipation for electronic devices is possible without using forced cooling with a fan or the like. Accordingly, rise in costs and generation of noise caused by providing a fan or the like may also be controlled. Furthermore, long term reliability is secured since the heat dissipating effect is not reduced due to failure of a fan or the like. Furthermore, since there is no need to provide a fan or the like, improving space efficiency within the case 1 as well as achieving weight reduction is possible, thereby contributing to the reduction in size and weight of electronic devices. Moreover, by applying the heat dissipating structure of this embodiment to forced cooling provided with a fan or the like, reduction of the load on the fan or the like, reduction of running costs, and reduction of noise become possible.

Furthermore, since the heat dissipating member 3 has a structure where the inner wall 10 and the outer wall 11 are connected via the multiple partition walls 12, it can function as an enforcing member with great mechanical strength. Accordingly, improving reliability in view of strength of the entire device provided with a heat dissipating member, as well as controlling rise in costs caused from additionally providing an enforcing member is possible.

Figure 8:
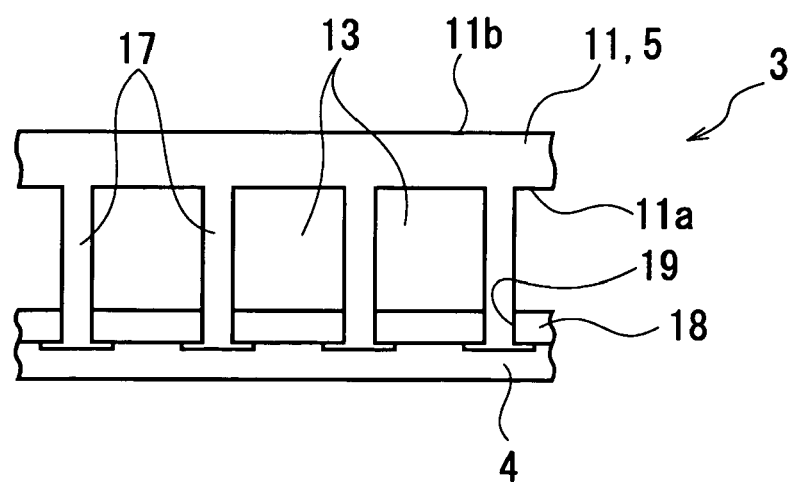
FIG. 8 is a cross-sectional view of a first modified example.

FIG. 8 is a cross-section illustrating a first modified example of the above embodiment, where the same symbols are given to the same structural portions as with the above embodiment, and description thereof will be omitted.

This modified example is one that has partition walls 17 formed as integrated protrusions on the inner side 11a of the synthetic resin outer wall 11, slits 19 corresponding to the partitions walls 17 formed in a metal plate inner wall 18, and the inner wall 18 fixed to the outer wall 11 by inserting each of the partition walls 17 into respective slits 19 and then crushing the tip portions thereof. It should be noted that the inner wall 18 may be fixed to the outer wall 11 using screws or through welding or the like.

According to such structure, since the partition walls 17 are made of a low thermally conductive synthetic resin, the rise in temperature of the outer side 11b of the outer wall 11 can be controlled by reducing the heat quantity passing through the partition walls 17.

Figure 9:
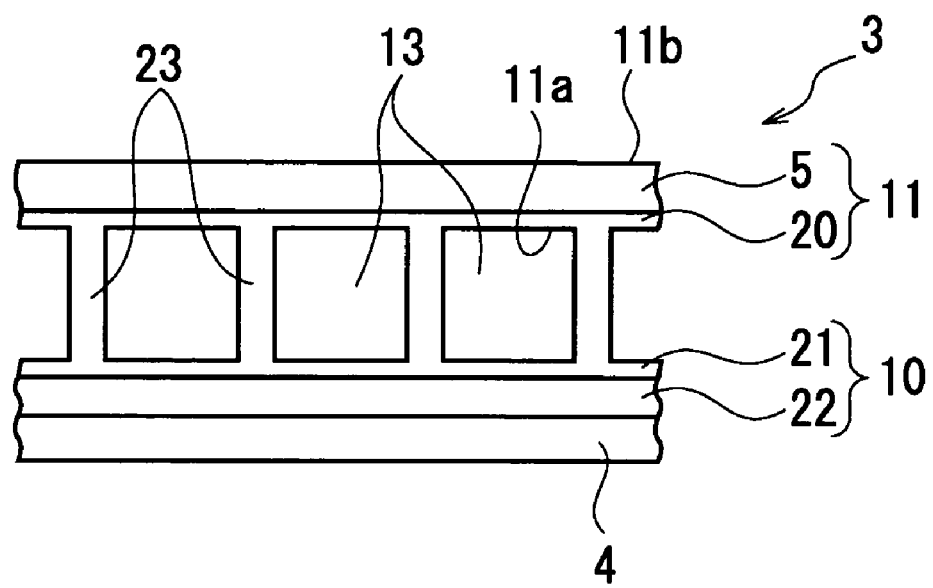
FIG. 9 is a cross-sectional view of a second modified example.

FIG. 9 is a cross-section illustrating a second modified example of the above embodiment, where the same symbols are given to the same structural portions as with the above embodiment, and description thereof will be omitted.

This modified example is one that has the peripheral walls 5 made of a highly thermally conductive material, the outer wall 11 configured of a peripheral wall 5 on the outer side 11b side and an outer wall resin plate 20 on the inner wall 11a side, the inner wall 10 configured of an inner wall resin plate 21 opposing the outer wall 11 and an inner wall metal plate 22 on the heat source side, and the outer wall resin plate 20, the inner wall resin plate 21, and partition walls 23 made of a synthetic resin as a single piece. The surface (the upper side in the drawing) of the outer wall resin plate 20 is fixed through surface contact on the inner side (the lower side in the drawing) of the peripheral wall 5, and the surface (the lower side in the drawing) of the inner wall resin plate 21 is fixed through surface contact on the outer side (the upper side in the drawing) of the peripheral wall 5. This fixation is carried out through unification by molding or using screws or through welding or the like.

According to such structure, since the inner wall resin plate 21, the partition walls 23, and the outer wall resin plate 20 are made of a low thermally conductive synthetic resin, the heat quantity passing from the inner wall 10 to the outer side 11b of the outer wall 11 is further reduced, thereby further controlling the rise in temperature of the outer side 11b of the outer wall 11. Furthermore, temperature differences occur at the portion of the outer wall resin plate 20 close to the partition walls 23 and portion far apart from the partition walls 23; however, since the surface of the outer wall resin plate 20 has surface contact with the highly thermally conductive metal peripheral wall 5, temperature distribution occurring at the outer side 11b can be dampened by favorably propagating the heat from the partition walls 23 across the entire outer side 11b of the outer wall 11. Moreover, since the peripheries of the through-holes 13 are defined by the same material, the temperature within the through-holes 13 may be even, and the heat dissipation performance due to the chimney effect is improved.

Figure 10:
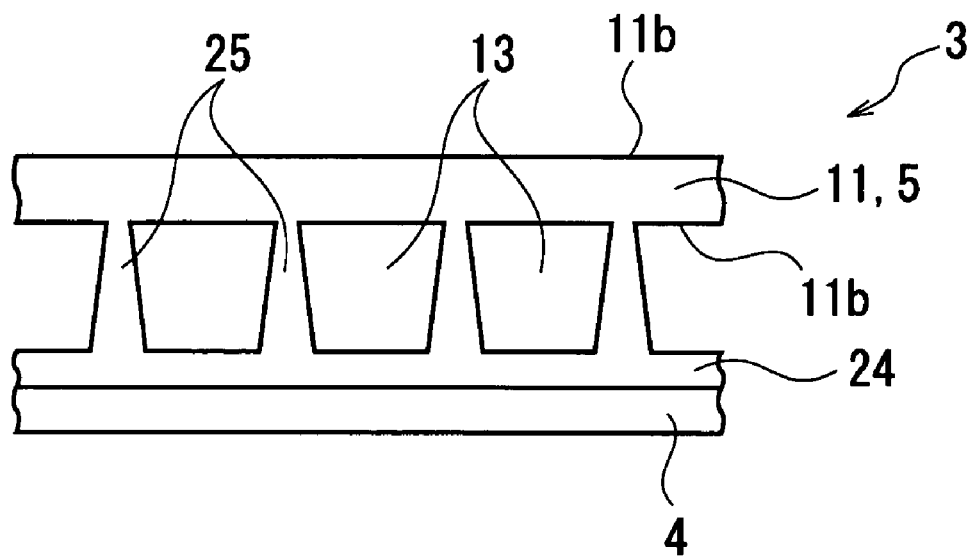
FIG. 10 is a cross-sectional view of a third modified example.

FIG. 10 is a cross-section illustrating a third modified example of the above embodiment, where the same symbols are given to the same structural portions as with the above embodiment, and description thereof will be omitted.

This modified example has an inner wall 24, partition walls 25, and the outer wall 11 (peripheral wall 5) made integrally of a single material. In this case, since a highly thermally conductive material is required for the inner wall 24, and the partition walls 25 and the outer wall 11 are also made of a highly thermally conductive material. Therefore, the thicknesses of the partition walls 25 need to be formed to be thin in order to reduce the passing heat quantity and control the rise in temperature of the outer side 11b of the outer wall 11. Meanwhile, there is also a limit to the thinness of the partition walls 25 in view of strength. Consequently, in this modified example, the partition walls 25 are formed to be a shape tapering from the inner wall 24 towards the outer wall 11.

According to such structure, since the contact areas between the partition walls 25 and the outer wall 11 are kept small by forming the partition walls 25 in a tapered shape, heat transfer from the partition walls 25 to the outer wall 11 is limited. This allows accurate control of rise in temperature of the outer side 11b exposed to the air. Furthermore, since the inner wall 24, the partition walls 25, and the outer wall 11 can be integrally formed, and the inner wall side of the partition walls 25 can be formed to have a sufficient thickness for strength, they do not lose their function as enforcing members.

It should be noted that in the above embodiment and modified examples thereof, the heat dissipating member 3 may be provided not only on one side wall of the peripheral wall 5 but also on an inner side of another side wall. Furthermore, when housing of an electronic device is a hollow cylinder, hollow ellipse, or polyhedron, a heat dissipating member 3 may be arranged on that peripheral wall or the inner side of each wall.

While preferred embodiments of the present invention have been described using specific terms, such description is for illustrative purposes, and it is to be understood that changes and variations may be made without departing from the spirit or scope of the following claims.

What is claimed is:

1. A heat dissipating structure for an electronic device, comprising:
   a heat source; and
   a heat dissipating member having an inner wall, an outer wall, and partition walls, wherein the inner wall directly or indirectly receives heat transfer from the heat source, the outer wall has an inner side and an outer side, the inner side opposes the inner wall at a distance there from, the outer side is exposed to the outside, the partition walls connect the inner wall and the inner side of the outer wall, the inner wall, the inner side of the outer wall and the partition walls define a plurality of through-holes, the through-holes are arranged along at least one of either the inner wall or the outer wall, each of the through-holes extends in a vertical direction within a tilt range in which gravitational influence is utilizable, and upper and lower ends of each of the through-holes open to the outside;

wherein generated heat from the heat source is propagated to the outer wall via the inner wall and the partition walls, and a predetermined amount of heat generated by the heat source passing from the heat source to the outer side of the outer wall is determined so that rise in temperature of the outer side relative to the ambient temperature can be kept under a predetermined value, wherein at least the outer side of the outer wall is made of a low thermally conductive material.

2. The heat dissipating structure according to claim 1, wherein
a region that directly or indirectly receives heat transfer from at least the heat source of the inner wall is made of a highly thermally conductive material.

3. The heat dissipating structure according to claim 1, wherein
the inner wall, the partition walls, and the inner side of the outer wall are made of the same material, and
the partition walls have a shape that tapers from the inner wall towards the outer wall.

4. The heat dissipating structure according to claim 1, wherein
the cross-section that is vertically orthogonal to the through-holes is approximately a quadrilateral, and
the width of the through-holes along the inner wall and the outer wall, interval between the inner wall and the outer wall, and the thickness of the partition walls are set in accordance with the thermal conductivity of the partition walls so as to effectively achieve a chimney effect due to the through-holes and heat transfer from the outer wall.

5. A heat dissipating device provided in an electronic device that has a heat source, comprising:
an inner wall that directly or indirectly receives heat transfer from the heat source;
an outer wall that has an inner side and an outer side, wherein the inner side opposes the inner wall at a distance from the inner wall, and the outer side is exposed to the outside; and
partition walls that connect the inner wall and the inner side of the outer wall, wherein the inner wall, the inner side of the outer wall and the partition walls define a plurality of through-holes, the through-holes are arranged along at least one of either the inner wall or the outer wall, each of the through-holes extends in a vertical direction within a tilt range in which gravitational influence is utilizable, and upper and lower ends of each of the through-holes open to the outside; wherein generated heat from the heat source is propagated to the outer wall via the inner wall and the partition walls, and a predetermined amount of heat generated by the heat source passing from the heat source to the outer side of the outer wall is determined so that rise in temperature of the outer side relative to the ambient temperature can be kept under a predetermined value, wherein at least the outer side of the outer wall is made of a low thermally conductive material.

6. The heat dissipating device according to claim 5, wherein
a region that directly or indirectly receives heat transfer from at least the heat source of the inner wall is made of a highly thermally conductive material.

7. The heat dissipating device according to claim 5, wherein
the inner wall, the partition walls, and the inner side of the outer wall are made of the same material, and
the partition walls have a shape that tapers from the inner wall towards the outer wall.

8. The heat dissipating device according to claim 5, wherein
the cross-section that is vertically orthogonal to the through-holes is approximately a quadrilateral, and
the width of the through-holes along the inner wall and the outer wall, interval between the inner wall and the outer wall, and the thickness of the partition walls are set in accordance with the thermal conductivity of the partition walls so as to effectively achieve a chimney effect due to the through-holes and heat transfer from the outer wall.

* * * * *